(12) United States Patent
Shimizu

(10) Patent No.: US 11,612,090 B2
(45) Date of Patent: Mar. 21, 2023

(54) COMPONENT MANAGEMENT SYSTEM, COMPONENT MOUNTING DEVICE, AND COMPONENT MANAGEMENT METHOD FOR PREDICTING COMPONENT EXHAUSTION

(71) Applicant: FUJI CORPORATION, Chiryu (JP)

(72) Inventor: Koji Shimizu, Kouta-cho (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/314,924

(22) PCT Filed: Jul. 14, 2016

(86) PCT No.: PCT/JP2016/070835
§ 371 (c)(1),
(2) Date: Jan. 3, 2019

(87) PCT Pub. No.: WO2018/011941
PCT Pub. Date: Jan. 18, 2018

(65) Prior Publication Data
US 2019/0313558 A1    Oct. 10, 2019

(51) Int. Cl.
*H05K 13/08* (2006.01)
*G05B 19/418* (2006.01)
(Continued)

(52) U.S. Cl.
CPC ......... *H05K 13/086* (2018.08); *G05B 13/042* (2013.01); *G05B 13/048* (2013.01);
(Continued)

(58) Field of Classification Search
CPC ............. H05K 13/086; H05K 13/0061; H05K 13/085; H05K 13/0882; G05B 19/41865; G05B 2219/45031
See application file for complete search history.

(56) References Cited

U.S. PATENT DOCUMENTS 7,493,857 B2 *   2/2009   Sasayama ............. G03F 7/3071
                                                        101/484
8,417,572 B1 *   4/2013   Chenault .............. G06Q 10/087
                                                        235/385
(Continued)

FOREIGN PATENT DOCUMENTS

CN          101052927 A      10/2007
JP          11-232339 A       8/1999
(Continued)

OTHER PUBLICATIONS

Extended European Search Report dated Feb. 7, 2020, in Patent Application No. 16908843.2, citing documents AA and AO-AQ therein, 11 pages
(Continued)

*Primary Examiner* — Kenneth M Lo
*Assistant Examiner* — Tameem D Siddiquee
(74) *Attorney, Agent, or Firm* — Oblon, McClelland, Maier & Neustadt, L.L.P.

(57) ABSTRACT

It is an object of the present invention to provide a component management system or the like that can accurately predict component exhaustion in a component mounting device that performs work at a line. Specifying section updates the time table based on the arrival time point or the unloading time point in each of component mounting devices. Arrival predicting section predicts the arrival time point in each component mounting device based on the time table and updates a prediction table. Since component-exhaustion predicting section acquires the arrival time point of a circuit board for which a component will be exhausted from the prediction table and calculates a component exhaustion time point, it is possible to predict the component exhaustion time point with high accuracy. An operator can (Continued)

perform a replenishment work based on the component exhaustion time point.

3 Claims, 5 Drawing Sheets

(51) Int. Cl.
*H05K 13/00* (2006.01)
*G05B 13/04* (2006.01)

(52) U.S. Cl.
CPC ... *G05B 19/41865* (2013.01); *H05K 13/0061* (2013.01); *H05K 13/085* (2018.08); *H05K 13/0882* (2018.08); *G05B 2219/45031* (2013.01)

(56) References Cited

U.S. PATENT DOCUMENTS

| | | | | |
|---|---|---|---|---|
| 2007/0270992 A1* | 11/2007 | Nishida | ............... | H05K 13/0885 |
| | | | | 700/111 |
| 2011/0290860 A1* | 12/2011 | Yang | ............... | H01L 24/78 |
| | | | | 228/102 |
| 2013/0074326 A1* | 3/2013 | Uekawa | ............... | H05K 13/08 |
| | | | | 29/739 |
| 2014/0358271 A1* | 12/2014 | Asakawa | ............. | G05B 19/402 |
| | | | | 700/112 |
| 2016/0202635 A1* | 7/2016 | Shirakata | ............. | G03G 15/556 |
| | | | | 399/27 |
| 2017/0236138 A1* | 8/2017 | Yamato | ............... | G01C 22/00 |
| | | | | 705/7.19 |

FOREIGN PATENT DOCUMENTS

| | | |
|---|---|---|
| JP | 11-312899 A | 11/1999 |
| JP | 2004063940 A | 2/2004 |
| JP | 2005-209919 A | 8/2005 |
| JP | 2006-310750 A | 11/2006 |
| JP | 5942090 B2 | 6/2016 |
| WO | WO 2004/103052 A1 | 11/2004 |
| WO | WO 2015/079497 A1 | 6/2015 |

OTHER PUBLICATIONS

Japanese Office Action dated Sep. 29, 2020 in Patent Application No. 2018-527334, 5 pages.
Office Action dated Mar. 23, 2020 in corresponding Chinese Patent Application No. 201680087559.X (with English Translation), citing document AO therein, 6 pages
International Search Report issued Aug. 30, 2016 in PCT/JP2016/070835 filed Jul. 14, 2016.

* cited by examiner

| No. | Device name | Remaining time period | Preparation limit | Information | Slot | State | Component name |
|---|---|---|---|---|---|---|---|
| 1 | NXT01 | 5 | 4 | | 5-1-1 | Preparation complete | 3216R-01 |
| 2 | AIMEX03 | 7 | 6 | | 1-2-5 | Preparation complete | 2125R-03 |
| 3 | NXT03 | 10 | 7 | | 4-1-3 | In front of device | 1005C-02 |
| 4 | NXT07 | 20 | 0 | ↑10 | 8-1-2 | Not delivered from warehouse | 1005C-01 |
| 5 | NXT01 | 25 | 24 | | 4-1-3 | Preparation complete | 1005C-02 |
| 6 | NXT05 | 30 | 27 | ↑10 | 8-1-2 | In front of device | 1005C-01 |
| 7 | AIMEX03 | 30 | 10 | | 8-1-2 | In front of device | 1005C-01 |

(b)

| No. | Device name | Remaining time period | Preparation limit | Information | Slot | State | Component name |
|---|---|---|---|---|---|---|---|
| 1 | NXT07 | 20 | 0 | ↑10 | 8-1-2 | Not delivered from warehouse | 1005C-01 |
| 2 | NXT01 | 5 | 4 | | 5-1-1 | Preparation complete | 3216R-01 |
| 3 | AIMEX03 | 7 | 6 | | 1-2-5 | Preparation complete | 2125R-03 |
| 4 | NXT03 | 10 | 7 | | 4-1-3 | In front of device | 1005C-02 |
| 5 | AIMEX03 | 30 | 10 | | 8-1-2 | In front of device | 1005C-01 |
| 6 | NXT01 | 25 | 24 | | 4-1-3 | Preparation complete | 1005C-02 |
| 7 | NXT05 | 30 | 27 | ↑10 | 8-1-2 | In front of device | 1005C-01 |

COMPONENT MANAGEMENT SYSTEM, COMPONENT MOUNTING DEVICE, AND COMPONENT MANAGEMENT METHOD FOR PREDICTING COMPONENT EXHAUSTION

TECHNICAL FIELD

The present application relates to a component management system, a component mounting device, and a component management method.

BACKGROUND ART

Heretofore, there has been proposed a method for predicting component exhaustion in a supply device for supplying electronic components to a board. Patent Literature 1 describes a method for giving advance notice of component exhaustion based on component consumption information acquired at periodic sampling points.

PATENT LITERATURE

Patent Literature 1: JP-A-2005-209919

BRIEF SUMMARY

Technical Problem

There is a system in which a supply device and a component mounting device for mounting electronic components supplied from the supply device on a board are arranged in a line, the boards on which the electronic components are to be mounted are sequentially conveyed downstream, and mounting is performed on the boards. In such a system, when an upstream component mounting device stops due to, for example, some abnormality and boards do not flow continuously down the line, the work of the downstream component mounting device is also interrupted until the board is conveyed. For this reason, there are instances in which the time period for component replenishment work of the component mounting device is extended by a time period required for the board to be conveyed.

In the method described in Patent Literature 1, the component exhaustion time point is updated at periodic sampling points, but there is a worry that the prediction is insufficient to reflect the state of the entire system. In particular, when the work of an upstream board mounting device is interrupted, there is a worry that component exhaustion in a downstream component mounting device cannot be accurately predicted.

The present disclosure has been made in view of the above-mentioned problems, and an object thereof is to provide a component management system or the like capable of accurately predicting component exhaustion in a component mounting device that performs work at a line.

Solution to Problem (1) An aspect of the component management system of the present application is a component management system for managing component mounting on a board in a component mounting line in which multiple work devices, including at least one component mounting device, are arranged in a line, the component management system comprising: a specifying section configured to specify a location of each board at the component mounting line; an arrival predicting section configured to predict an arrival time point of each board at a target device based on the location specified by the specifying section, the target device being defined as one of the component mounting devices; a component-exhaustion predicting section configured to calculate the number of boards to be mountable based on the number of remaining components and the number of components to be mounted per board in the target device, and configured to predict a component exhaustion time point, at which the component is exhausted in the target device, based on the number of boards and the arrival time point, and a notification section configured to report the component exhaustion time point or a component supply time point based on the component exhaustion time point.

In this manner, the component-exhaustion predicting section can accurately predict the component exhaustion time point based on the arrival time point predicted by the arrival predicting section based on the location specified by the specifying section. In addition, an operator operating the component mounting device can perform the replenishment work of the component in accordance with the component exhaustion, based on the component exhaustion time point or the component supply time point reported by the notification section. The component exhaustion time point and the component supply time point are not limited to the time point but may be a time period from the current time point to the component exhaustion time point or a time period from the current time point to the component supply time point, respectively.

(2) Further, another aspect is providing a replenishment time point calculating section configured to calculate a component replenishment time point, which is a start time limit of component replenishment, based on the component exhaustion time point and a replenishment time period required for the component replenishment.

For example, there is a case where, due to a difference in the storage location of components, the work time period of the replenishment work performed by the operator is not uniform. The operator can efficiently perform the replenishment work based on the replenishment time point for which the replenishment time period is reflected.

(3) Further, another aspect is that the specifying section specifies the location by acquiring the arrival time point or an unloading time point of the board at each of the working devices. Thus, the specifying section can specify the location of the board based on the arrival time point or the unloading time point.

(4) Further, another aspect is that the arrival predicting section predicts the arrival time point based on the arrival time point or the unloading time point, a work time period of each of upstream devices located upstream of the target device, and a conveyance time period required for the board to be conveyed from the upstream device to the target device. As a result, the arrival predicting section can predict the unloading time point of the upstream device based on either the arrival time point or the unloading time point in the upstream device.

(5) Further, another aspect is that, when mounting work of the upstream device is interrupted, the arrival predicting section predicts an arrival time point of a board after a board already unloaded from the interrupted device based on a current time point, the work time of the interrupted device and the work time of each of the upstream devices on the component mounting line from the interrupted device to the target device, and the conveyance time from the interrupted device to the target device.

When the upstream device is interrupted, it takes at least a time period obtained by adding the mounting time period of the upstream device and the conveyance time period until a board unloaded after restarting reaches the target device. The arrival predicting section can predict the arrival time point based on the current time point, the mounting time period, and the conveyance time period. The component-exhaustion predicting section can accurately predict the component exhaustion time point by reflecting the case where the upstream device is interrupted.

(6) Further, another aspect is that the notification section reports that the component exhaustion time point may be delayed when mounting by the upstream device is interrupted. As a result, an operator can efficiently perform the replenishment work in accordance with whether there is a possibility of the delay. As a method of reporting, it is preferable that the notification section has a display, and the component exhaustion time point, which may be delayed, is displayed, for example, with a different display color.

(7) Further, another aspect is that the notification section reports an elapsed time period from the interruption when mounting of the upstream device is interrupted. As a result, an operator can estimate the time period until restart based on the elapsed time period and can efficiently perform the replenishment work.

(8) Further, another aspect is that, when the component mounting device in the component mounting line includes multiple component mounting devices, the notification section reports the component exhaustion time point or the component supply time point in earlier to later order based on the arrival time point predicted by the arrival predicting section for each of the component mounting devices.

In some cases, a single operator is in charge of replenishment work relating to multiple component mounting devices. In the case where the timings of the replenishment work overlap, the operator can easily determine the priority of the replenishment work based on the component exhaustion time points reported in earlier to later order.

(9) Further, another aspect is that the component mounting device, which is managed by the component management system described in any one of (1) to (8), includes a device notification section configured to report the component exhaustion time point or the component supply time point. As a result, an operator can check the nearest one of the notification section or the device notification section.

(10) Further, another aspect of the component management method of the present application is a component management method for managing a component mounting on a board in a component mounting line in which multiple work devices, including at least one component mounting device, are arranged in a line, the method including: a specifying step of specifying a location of each board at the component mounting line; an arrival predicting step of predicting an arrival time point of each board in a target device, which is one of the component mounting devices, based on the location specified by the specifying step; a component-exhaustion predicting step of calculating the number of boards that can be mounted based on the number of components remaining and the number of components to be mounted per board in the target device, and predicting a component exhaustion time point, at which the component is exhausted in the target device, based on the number of boards and the arrival time point; and a notifying step of reporting the component exhaustion time point or a component supply time point based on the component exhaustion time point. The present disclosure according to the present application is not limited to the present disclosure of the component management system, and can be implemented as an present disclosure of the component management method.

Advantageous Effects

According to the component management system or the like of the present application, it is possible to accurately predict component exhaustion in a component mounting device that performs work at a line.

BRIEF DESCRIPTION OF DRAWINGS

FIG. 5 is a view showing the display screen of a component exhaustion prediction table, in which (a) is a display screen sorted in the order of "remaining time period", and (b) is a display screen sorted in the order of "preparation limit".

DESCRIPTION OF EMBODIMENTS

Configuration of Component Management System

Figure 1:
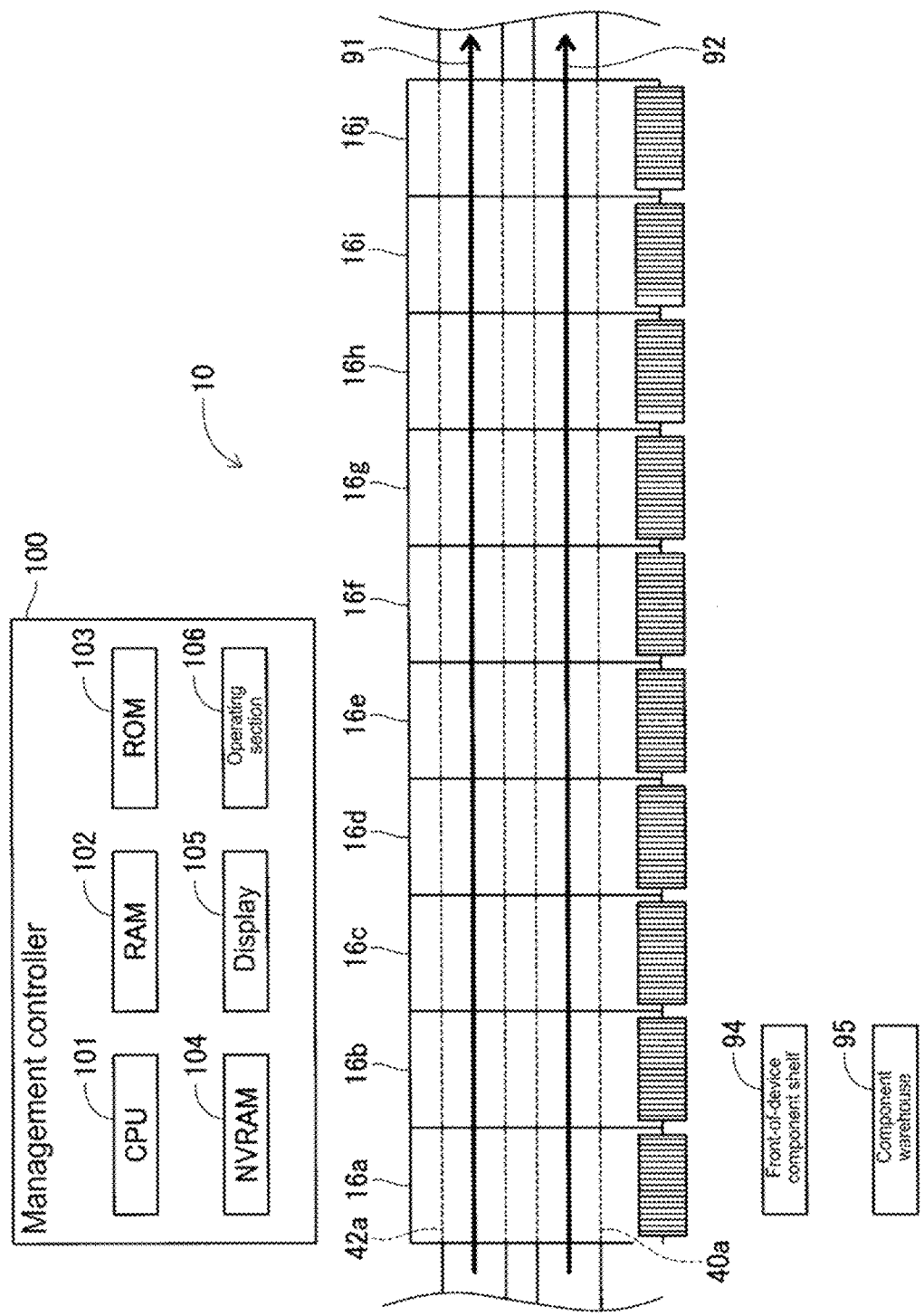
FIG. 1 illustrates a configuration of a component management system of an embodiment.
Figure 2:
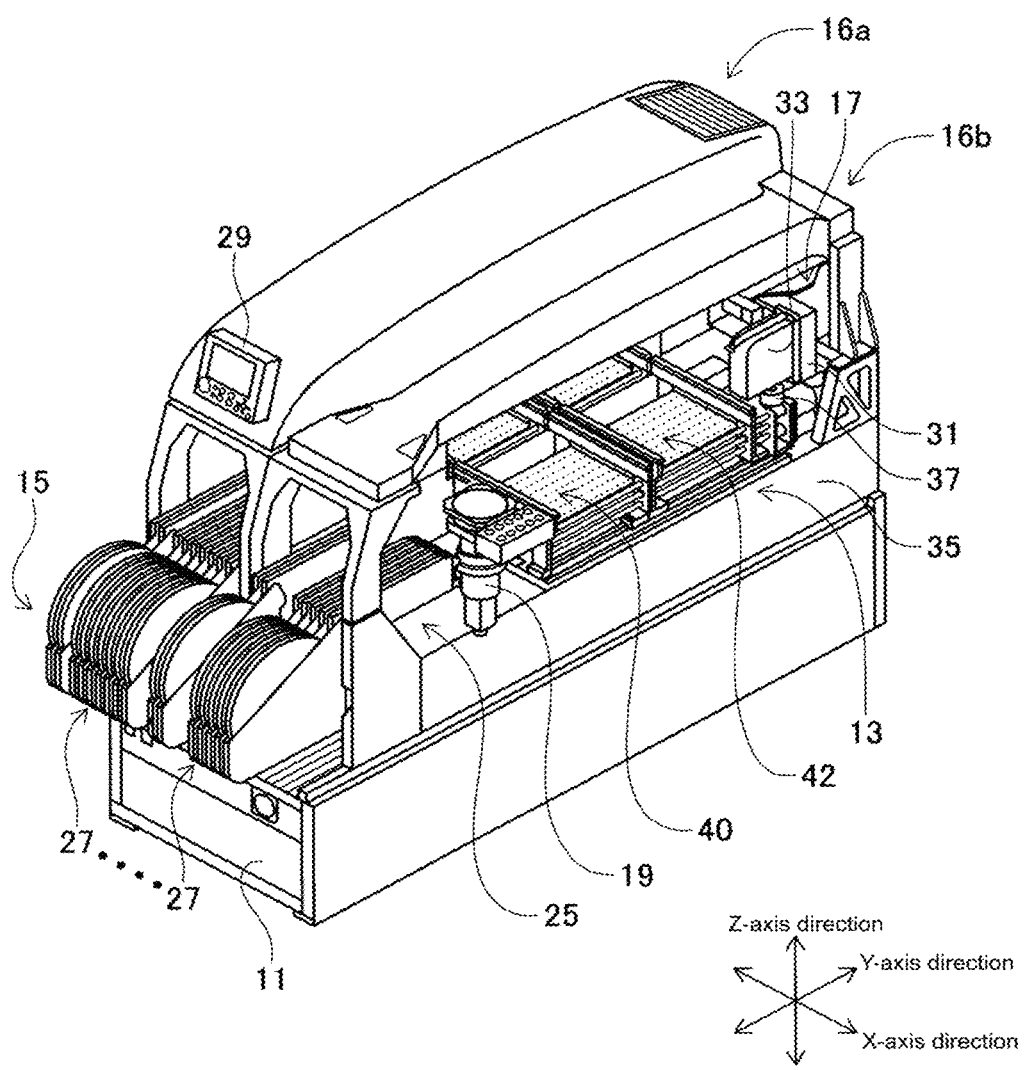
FIG. 2 is a perspective view showing a device configuration of a component mounting device.

Component management system 10 will be described with reference to FIG. 1. Component management system 10 includes management controller 100, component mounting devices 16a to 16j, front-of-device component shelf 94, and component warehouse 95. Component mounting devices 16a to 16j have the same configuration, and when they are not distinguished from each other, they are collectively referred to as component mounting device 16 in some cases. As will be described later, component mounting devices 16a to 16j mount electronic components on a circuit board conveyed by first conveyance devices 40 (FIG. 2) and second conveyance devices 42 (FIG. 2). Ten component mounting devices 16 are installed in a line, and component mounting lines 91 and 92 are formed by first conveyance devices 40 and second conveyance devices 42 respectively, which are connected adjacently. Here, it is assumed that component mounting device 16a is located upstream of component mounting lines 91 and 92, and circuit boards are conveyed in the direction of the arrows in FIG. 1. Although omitted in FIG. 1, for example, a solder printing device, a solder inspection device, and the like are installed in a line on the upstream side of component mounting device 16, and a mounting inspection device, a reflow device, a soldering inspection device, a board accommodation device, and the like are installed in a line on the downstream side of component mounting device 16. Component mounting lines 91 and 92 are part of a production line in which circuit boards on which a large number of electronic components are mounted are produced by the various devices described above. In FIG. 1, first conveyance device 40 and second conveyance device 42 included in component mounting device 16a are respectively illustrated as first conveyance device 40a and second conveyance device 42a, and reference numerals of first conveyance devices 40 and second conveyance devices 42 included in other component mounting devices 16 are omitted.

Management controller 100 manages mounting of electronic components on a circuit board in component management system 10. Management controller 100 is implemented by, for example, a PC, and includes CPU 101, RAM 102, ROM 103, NVRAM (nonvolatile RAM) 104, display 105, operating section 106, and the like. CPU 101 controls a connected display 105 or the like by executing various programs stored in ROM 103. RAM 102 is used as a main memory for CPU 101 to execute various processing. ROM 103 stores control programs, various data, and the like. Various types of information described later are stored in NVRAM 104. Display 105 is, for example, a liquid crystal display, and displays, for example, various setting screens, operation states of the devices, a component-exhaustion predicting table to be described later, and the like in accordance with instructions of CPU 101. Operation section 106 includes a keyboard and a mouse, which are not shown, and receives an operation of an operator.

Front-of-device component shelf 94 and component warehouse 95 are places for storing tape reels 27 (FIG. 2) supplied to component supply device 15 (FIG. 2). Here, it is assumed that component warehouse 95 is farther from component mounting device 16 than front-of-device component shelf 94.

Configuration of Component Mounting Device

FIG. 2 is a perspective view showing two of ten component mounting devices 16 configuring component management system 10, for the purpose of describing component mounting device 16. FIG. 2 shows component mounting devices 16*a* and 16*b* arranged in parallel on common base 11. In FIG. 2, for the sake of description, the inside of component mounting device 16*b* is shown by omitting a part thereof. In component mounting device 16, various devices such as board conveyance device 13, component supply device 15, head drive mechanism 17, and camera device 19 are mounted on common base 11. In the following description, as shown in FIG. 2, the direction in which component mounting devices 16 are arranged in parallel is referred to as the X-axis direction, the direction parallel to the board plane of a circuit board to be conveyed and perpendicular to the X-axis direction is referred to as the Y-axis direction, and the direction perpendicular to both the X-axis direction and the Y-axis direction is referred to as the Z-axis direction.

Board conveyance device 13 is a so-called double conveyor type device in which first conveyance device 40 and second conveyance device 42 are arranged side by side in the Y-axis direction. Each of first and second conveyance devices 40 and 42 has a pair of conveyor belts (not shown) arranged along the X-axis direction. Each of first and second conveyance devices 40 and 42 rotates the pair of conveyor belts and conveys a circuit board supported on the conveyor belts in the X-axis direction. Each of first and second conveyance devices 40 and 42 holds and fixes a circuit board, conveyed to the stop position where the mounting work of a component is performed, by a stopper (not shown) provided at the upper portion of the circuit board and a damper (not shown) provided at the lower portion of the circuit board, in the Z-axis direction. Each of first and second conveyance devices 40 and 42 conveys the circuit board carried in from the upstream device in the X-axis direction and clamps the circuit board at the stop position. When the mounting work is completed, first and second conveyance devices 40 and 42 convey the circuit board in the X-axis direction and unload the circuit board to the downstream device.

Component supply device 15 is a feeder type device and is provided at a front end portion (lower left side in FIG. 2) in the Y-axis direction of component mounting device 16. In component supply device 15, multiple feeders 25 are arranged in parallel in the X-axis direction on common base 11. Each feeder 25 is configured to be detachable with respect to common base 11 and supplies electronic components from tape reel 27 to a supply position. A not-shown slot for attaching each feeder 25 is provided on common base 11. The multiple slots are assigned respective slot numbers. Tape reel 27 is a medium for supplying electronic components and is wound with a carrier tape which holds a large number of electronic components at constant intervals. In feeder 25, the distal end of the carrier tape is pulled out to the supply position, and different types of electronic components are supplied for respective carrier tapes. The supply positions of feeders 25 are arranged in parallel along the X-axis direction. Therefore, the supply position is different in the X-axis direction for different types of electronic components.

Head drive mechanism 17 is an XY robot type moving device. Head drive mechanism 17 includes an X-axis drive mechanism (not shown) for sliding slider 31 in the X-axis direction by driving the electromagnetic motor and a Y-axis drive mechanism (not shown) for sliding the slider in the Y-axis direction. Mounting head 33 is attached to slider 31. Mounting head 33 is moved to any position on frame section 35 of each of component mounting devices 16 mounted on common base 11 by driving the X-axis drive mechanism and the Y-axis drive mechanism. The X-axis drive mechanism and the Y-axis drive mechanism can use, for example, a linear motor mechanism, a ball screw feed mechanism, or the like as a drive source.

Nozzle holder 37 is provided below mounting head 33. Nozzle holder 37 holds multiple mounting nozzles downward. Each of the mounting nozzles communicates with a negative pressure air passage and a positive pressure air passage through a positive/negative pressure supply device (not shown), picks up and holds an electronic component by the negative pressure, and releases the held electronic component by being supplied with a slight positive pressure.

Camera device 19 is provided between board conveyance device 13 and component supply device 15 in the Y-axis direction. Camera device 19 is installed on frame section 35 so that camera device 19 captures images in the upward direction. The imaging position in the present embodiment is set in the space above camera device 19. Camera device 19 captures an image of an electronic component, which is picked up by the mounting nozzle passing through the imaging position, from below.

Component mounting device 16 has a control section (not shown). The control section is connected to above-described board conveyance device 13, component supply device 15, and camera device 19 via a communication cable. The control section acquires various types of information from devices 13 to 19, and executes calculation, determination, and the like based on the acquired information. The control section appropriately controls the operations of devices 13 to 19 based on the calculation result and the determination result. In component mounting device 16 of the present embodiment, the component mounting work is controlled by the control section. Component mounting device 16 is provided with operation device 29 at the front end portion of the upper cover. An operator can confirm the information output from the control section to operation device 29 and perform necessary operations and settings on operation device 29.

In component mounting device 16 having the above-described configuration, the mounting work of driving mounting head 33 and mounting an electronic component from the supply position at the mounting position of a circuit board is repeatedly executed based on the control of the control section. Specifically, first, head drive mechanism 17 moves mounting head 33 to a position above the supply position of feeder 25 to which an electronic component to be mounted is supplied. Mounting head 33 picks up the electronic component at the supply position by the mounting nozzle. Next, head drive mechanism 17 moves mounting head 33 to an imaging position above camera device 19. Camera device 19 captures an image of a state in which the mounting nozzle picks up the electronic component from below. Next, head drive mechanism 17 moves mounting head 33 to a position above the circuit board which is positioned at the stop position by board conveyance device 13. Control section 51 corrects the deviation of the pick-up position of the electronic component held by the mounting nozzle based on the imaging data of camera device 19 before mounting the electronic component at the mounting position of the circuit board. Mounting head 33 drives Z-axis drive mechanism 47, thereby extending the mounting nozzle downward in the Z-axis direction. When the electronic component comes into contact with the mounting position of the circuit board, mounting head 33 eliminates the negative pressure of the mounting nozzle to release the electronic component and mount the electronic component on the circuit board.

Feeder 25 and tape reel 27 are given IDs as identifiers. Specifically, bar codes indicating respective IDs are attached to feeder 25 and tape reel 27. Upon setting at the production line, management controller 100 stores the name of the electronic component accommodated and the quantity of the electronic component in NVRAM 104 for each of tape reels 27 in conjunction with the ID of tape reel 27. The IDs of feeder 25 and tape reel 27 are referred to as a feeder ID and a tape feeder ID, respectively, in some cases.

Component Exhaustion and Replenishment Work

Since component of tape reel 27 of component supply device 15 is consumed in accordance with the mounting work of component mounting device 16, the remaining amount of the components of tape reel 27 is gradually depleted and the component is exhausted. When component of tape reel 27 is exhausted, an operator performs replenishment work. Here, it is assumed that the operator first performs replenishment work including a first step of moving tape reel 27 from component warehouse 95 to front-of-device component shelf 94, and a second step of taking out tape reel 27 from front-of-device component shelf 94 and replenishing the tape reel to component supply device 15.

The specific contents of the second stage work will be described. In component supply device 15, multiple feeders 25 are allocated for supplying the same type of electronic components. Component supply device 15 supplies electronic components from one feeder 25, and when the component of tape reel 27 of this feeder 25 is exhausted, feeder 25 for supplying electronic components is switched to next feeder 25. The operator removes empty feeder 25 which is allocated for supplying electronic components of the same kind as feeder 25 of which component will soon be exhausted. Here, empty feeder 25 is feeder 25 on which tape reel 27 is not set. Next, operation device 29 is operated to input that feeder exchange work is to be performed and the slot number of empty feeder 25 that has been removed. Next, the operator causes a not-shown barcode reader to read respective barcodes of new tape reel 27 to be supplied and removed empty feeder 25. The barcode reader is connected to the control section of component mounting device 16, and the information read by the barcode reader is transmitted to the control section. Next, new tape reel 27 is attached to empty feeder 25 and the feeder is attached to the same slot as the removed slot. Component mounting device 16 transmits the input slot number and the IDs of feeder 25 and tape reel 27 to management controller 100. Management controller 100 determines whether the type of feeder 25 of which component has been exhausted matches the type of empty feeder 25 that has been removed, and displays an error on, for example, operation device 29 in the case of a mismatch. When the mounting work of component mounting device 16 advances and feeder 25, which was nearing exhaustion, reaches a component-exhausted state, the operator replaces feeder 25, for supplying components, from feeder 25 in the component-exhausted state to replenished feeder 25 and enters the completion of the exchange work via operation device 29. In the second stage described above, the first work can be performed separately from the second work, with the first work comprised of tape reel 27 being taken out from front-of-device component shelf 94 and set in empty feeder 25, and the feeder 25 then being attached to component supply device 15, and the second work comprised of replacing feeder 25 after the component is exhausted. Here, it is assumed that the time period required for the first work and the second work is 3 minutes, and the time period required for the second work is 1 minute. It is also assumed that the time period required to complete the second work from the first stage to the second stage is 20 minutes.

Now, there is a case where one operator is in charge of the replenishment work of multiple component supply devices 15. In the case where the timings of the replenishment work for multiple component supply devices 15 overlap, for example, giving priority to the replenishment work of the feeder which is nearing component exhaustion is required. Therefore, management controller 100 predicts the component exhaustion time period and displays the prediction result on, for example, display 105. Based on the displayed prediction result, the operator can decide the priority order and perform the replenishment work.

Function Blocks

Figure 3:
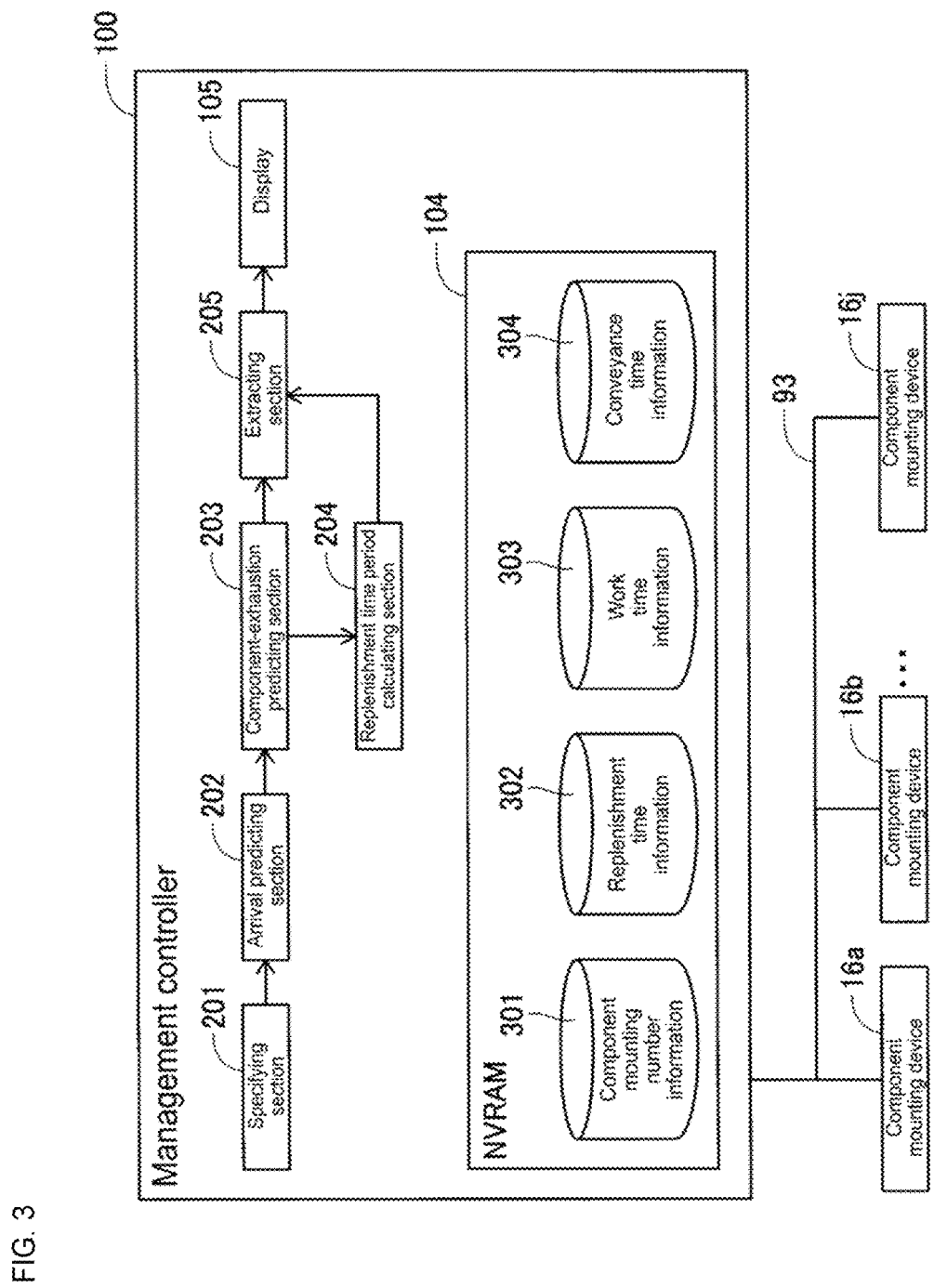
FIG. 3 is a function block diagram of the component management system.

Next, functional blocks included in management controller 100 will be described with reference to FIG. 3. In addition to display 105, management controller 100 includes specifying section 201, arrival predicting section 202, component-exhaustion predicting section 203, replenishment time period calculating section 204, extracting section 205, and the like. In addition, component mounting number information 301, replenishment time information 302, work time information 303, conveyance time information 304, and the like are stored in advance in NVRAM 104. Management controller 100 and component mounting device 16 are connected via communication cable 93 and can communicate information bidirectionally. Specifying section 201, arrival predicting section 202, component-exhaustion predicting section 203, replenishment time period calculating section 204, and extracting section 205 are realized by causing CPU 101 to execute various programs stored in ROM 103.

Component mounting number information 301 is information on the component name of an electronic component to be mounted and the number of components mounted per circuit board for each component mounting device 16. Replenishment time information 302 is information of the time period required for an operator to perform the replenishment work of tape reel 27, and more specifically, is the time period required for the first and second stages of the replenishment work described above. Work time information 303 is the work time period per circuit board 1 required for the mounting work of each component mounting device 16. Conveyance time information 304 is a time period required for the conveyance of a circuit board between adjacent component mounting devices 16, and is, for example, a time period from the time point when a circuit board is unloaded from component mounting device 16a to the time point when the circuit board arrives at component mounting device 16b. Work time information 303 and conveyance time information 304 are information based on theoretical values at the time of creation of a production program for operating a production line or actual values of past production by operating a production line.

Specifying Section

Component mounting device 16 transmits an arrival signal and an unloading signal to management controller 100 when a circuit board arrives and is unloaded, respectively. Specifying section 201 specifies the location of the circuit board based on the received arrival signal and the unloading signal and stores the location in RAM 102. Like feeder 25 and tape reel 27, a bar code indicating an ID is also attached to a circuit board, so that each circuit board can be identified. Specifically, specifying section 201 stores a time table (not shown) having items including "board ID", "unloading device", "unloading time point", "arrival device", "arrival time point", and "location device" in RAM 102 for each circuit board, and updates the time table when a new arrival signal or unloading signal is received. For example, for a board having a board ID of 1, when the unloading signal is received from component mounting device 16a at 9:00 and the arrival signal is received from component mounting device 16b at 9:03, the time table stores the following values in the row of the value (1) of the "board ID": (16a) as the value of the "unloading device", (9:00) as the value of the "unloading time point", (16b) as the value of the "arrival device", and (9:03) as the value of the "arrival time point". Further, "location device" is specified by the latest one of the value of the "unloading time point" and the value of the "arrival time point". In the example, since the "arrival time point" is the latest value, it is specified that a board is located at component mounting device 16b which is the "arrival device", and the value of the "location device" is set to (16b). When the "unloading time point" is the latest, component mounting device 16 adjacent to the downstream side of component mounting device 16 with the value of the "unloading device" is set to the value of the "location device". For example, when the value of the "unloading device" is (16b), the value of the "location device" is (16c). Incidentally, with respect to the arrival time point in component mounting device 16a furthest upstream, the arrival time point is determined based on, for example, the arrival time point or the unloading time point in the solder inspection device located on the upstream side of component mounting device 16a. The time table is sorted in the order of conveyance in component mounting lines 91 and 92, with the downstream side being the head.

When the mounting work is interrupted, component mounting device 16 transmits an interruption signal to management controller 100. Upon receiving the interruption signal, specifying section 201 updates an interruption table (not shown) stored in RAM 102. The interruption table is a table whose items are "interrupted device" and "interruption time point". For example, when the interruption signal is received from component mounting device 16a at 9:00, management controller 100 stores (16a) as the value of the "interrupted device" and (9:00) as the value of the "interruption time point". When interrupted component mounting device 16 restarts the mounting work, component mounting device 16 transmits a restart signal to management controller 100. Upon receipt of the restart signal, management controller 100 removes, from the interruption table, the row in which component mounting device 16 having transmitted the interruption signal is set as the value of the "interrupted device".

Arrival Predicting Section

Arrival predicting section 202 executes arrival prediction processing every predetermined time period, and predicts the arrival time points to component mounting devices 16 of individual circuit boards which are conveyed on component mounting lines 91 and 92. Arrival predicting section 202 predicts the arrival time point based on the time table, the interruption table, work time information 303, and conveyance time information 304.

The arrival prediction processing will be described. Arrival predicting section 202 executes arrival prediction processing on each of the circuit boards stored in the time table. First, arrival predicting section 202 determines whether there is a device in an interruption state (hereinafter, referred to as an interrupted device) in component mounting device 16 having the value of "location device" in the time table (hereinafter, referred to as a location device) and in component mounting device 16 located upstream of the location device (hereinafter, referred to as an upstream device). In some cases, mounting work of component mounting device 16 is interrupted by, for example, an abnormality, component exhaustion, or the like. When the location device and the upstream device are described in the interruption table, arrival predicting section 202 determines that there is an interrupted device. When it is determined that there is no interrupted device, it is determined whether the latest value of the "unloading time point" and the "arrival time point" is the "arrival time point". When it is determined that the "arrival time point" is not the latest, the value of the "unloading time point" is added to the conveyance time which is required for the conveyance from component mounting device 16 as the "unloading device" to component mounting device 16 adjacent to the downstream side (hereinafter, referred to as a first downstream device), thereby obtaining the arrival time point in the first downstream device. Next, it is determined whether there is component mounting device 16 adjacent to the downstream side of the first downstream device (hereinafter referred to as a second downstream device). If it is determined that there is the second downstream device, the work time period of the first downstream device and the conveyance time period from the first downstream device to the second downstream device are added to the obtained arrival time point, thereby obtaining the arrival time point in the second downstream device. Hereinafter, the arrival time point is calculated in the same manner until it is determined that there is no component mounting device 16 adjacent to the downstream side, that is, until the calculation of the arrival time point in component mounting device 16j located at the most downstream side is completed. When it is determined that the latest value of the "unloading time point" and the "arrival time point" is the "arrival time point", the work time period of component mounting device 16 as the "arrival device" and the conveyance time period are added to the "arrival time point", thereby obtaining the arrival time point in component mounting device 16 which is adjacent to the downstream side of component mounting device 16 as the "arrival device". Hereinafter, the calculation of the arrival time point is repeated in the same manner as described above until the calculation of the arrival time point in component mounting device 16*j* located furthest downstream is completed.

On the other hand, when it is determined that there is an interrupted device, arrival predicting section 202 calculates the arrival time point at component mounting device 16 adjacent to the downstream side of the interrupted device by adding, to the current time point, the work time period of the interrupted device and the conveyance time period which is required for the conveyance from the interrupted device to component mounting device 16 adjacent to the downstream side of the interrupted device. The calculation of the arrival time point is repeated in the same manner until the calculation of the arrival time point in component mounting device 16*j* located furthest downstream is completed.

When it is determined that there is no component mounting device 16 adjacent to the downstream side, arrival predicting section 202 completes the arrival prediction processing. Note that, arrival predicting section 202 stores the arrival time point of each of the circuit boards calculated by the arrival prediction processing as values of a prediction table (not shown) to be stored in RAM 102. The prediction table is a table having items of "board ID", and "interruption presence/absence" and "interruption time point" for each of component mounting devices 16*a* to 16*j*. For example, fora board having the board ID of 1, when the arrival signal is received from component mounting device 16*i* at 9:00 and the arrival time point in component mounting device 16*j* is calculated as 9:10, the prediction table stores the following values in the row of the value (1) of the "board ID": (9:00) as the value of "16*i*" and (9:10) as the value of "16*j*". Further, the initial value of the "interruption" is (NG), and when arrival predicting section 202 determines that there is an interrupted device in the arrival prediction processing, the value of the "interruption" is updated to (OK) and the value of the "interruption time point" is updated to the value of the "interruption time point" in the interruption table when updating any of the values of component mounting devices 16*a* to 16*j*. When arrival predicting section 202 determines that there is no interrupter in the arrival prediction processing, the value of "interrupt" is updated to (NG) when updating any of the values of component mounting devices 16*a* to 16*j*.

Component-exhaustion Predicting Section and Supply Time Period Calculating Section Component-exhaustion predicting section 203 and replenishment time period calculating section 204 execute the component exhaustion prediction processing every predetermined time period, and predict the component exhaustion time point of each of component mounting devices 16 based on the prediction table and component mounting number information 301. In addition, component-exhaustion predicting section 203 updates the values of a component table (not shown) to be stored in RAM 102 based on the unloading signal received by management controller 100, and the slot number and the IDs of feeder 25 and tape reel 27 which are input in the replenishment work performed by an operator. The component table is a table having items of "device name", "slot number", "feeder ID", "tape feeder ID", "component name", "number of components remaining", "component exhaustion time period", "preparation limit time period", "state", "interruption presence/absence", and "interruption time point".

Predicting section 203 sets one of component mounting devices 16*a* to 16*j* as the value of the "device name". The values of the "slot number", "feeder ID", and "tape feeder ID" are set as the slot number, the ID of feeder 25 and the ID of tape reel 27, which are input in the replenishment work, respectively. The value of the "component name" is a component name specified from the value of the "tape feeder ID". The "number of components remaining" is a quantity in tape reel 27 which is specified from the value of the "tape feeder ID" when the completion of the replacement work is input in the replenishment work. Note that predicting section 203 identifies the component names and quantities by referring to the information stored in NVRAM 104 which is stored at the time of acceptance. Further, each time management controller 100 receives the unloading signal, the value of the "number of components remaining" is updated to a value obtained by subtracting the number of components mounted per corresponding circuit board from the value of the corresponding "number of components remaining".

The "state" takes any value of "not delivered", "front of device", or "prepared". The "not delivered" indicates that tape reel 27 is stored in component warehouse 95. The "front of device" indicates that tape reel 27 is stored in front-of-device component shelf 94. The "prepared" indicates that tape reel 27 is attached to component supply device 15. The initial value of the "state" is "not delivered". When a predetermined operation is performed by the operator on a display screen displaying the prediction result of component exhaustion, which will be described later, the value of the "state" is updated from "not delivered" to "front of device". Further, in the replenishment work, when execution of the feeder replacement work is input, the value of the "state" of the slot number assigned to the same type of electronic component as the slot number corresponding to input component mounting device 16 is updated to "Prepared". The values of the "component exhaustion time period", "preparation limit time period", "interruption presence/absence", and "interruption time point" are updated in the component exhaustion prediction processing.

Figure 4:
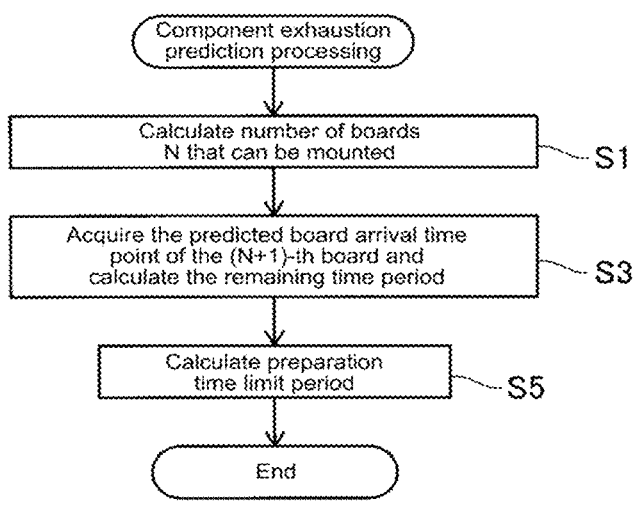
FIG. 4 is a flowchart showing the processing content of component exhaustion prediction processing.

Next, with reference to FIG. 4, a description will be given of the component exhaustion prediction processing. Component-exhaustion predicting section 203 executes the component exhaustion prediction processing for each of feeders 25 described in the component table. First, component-exhaustion predicting section 203 divides the value of the "number of components remaining" by the number of components mounted per circuit board to calculate the number N of boards that can be mounted (S1). Next, the predicted board arrival time point of the (N+1)-th circuit board is acquired, and the remaining time period is calculated (S3). More specifically, component-exhaustion predicting section 203 refers to the prediction table and acquires the arrival time point of the circuit board which is the (N+1)-th to arrive at component mounting device 16 as the target of the component exhaustion prediction processing. Next, the current time point is subtracted from the acquired arrival time point to calculate the remaining time period until the component is exhausted. The calculated remaining time period is set as the value of the "remaining time period" in the component table. Further, with respect to the circuit board which is the (N+1)-th to arrive, when the value of the "interruption" in the prediction table is (OK), the value of the "interruption" in the component table is updated to (OK), and the "interruption time point" is updated to the value of the "interruption time point" in the prediction table. Next, replenishment time period calculating section 204 calculates the preparation limit time period by subtracting the replenishment time period from the remaining time period calculated by component-exhaustion predicting section 203, sets the calculated preparation limit time period as the value of the "preparation limit time period" in the component table (S5), and completes the processing. The replenishment time period is a time period corresponding to the value of the "state" with reference to replenishment time information 302. If the "state" is "not delivered", the replenishment time period is 20 minutes, which is the time period from the first stage. If the "state" is "front of device", the replenishment time period is 3 minutes, which is the time period from the first work of the second stage. If the "state" is (prepared), the replenishment time period is 1 minute, which is the time period from the second work of the second stage.

As a method of predicting the component exhaustion time period, a method of calculating the component exhaustion time period based on the work time period, the number of components remaining, and the number of components mounted per board in each of component mounting devices 16 is also conceivable. More specifically, for example, when the work time period is 30 seconds, the number of components remaining is 500, and the number of components mounted is 10, the value obtained by dividing 500 by 10 is multiplied by 30, and thus obtained 1,500 seconds is set as the component exhaustion time period. However, when the work is performed in component mounting lines 91 and 92, the arrival time point of a circuit board is delayed in some cases. This is the case, for example, where mounting work by above-mentioned upstream component mounting device 16 is interrupted. In the present embodiment, since the component exhaustion time period is calculated based on the unloading time point or the arrival time point in upstream component mounting device 16, the component exhaustion time period can be calculated with high accuracy. Further, when mounting work by upstream component mounting device 16 is interrupted, it takes time from the restart of the mounting work of upstream component mounting device 16 to the arrival of a circuit board at downstream component mounting device 16. The time period until a circuit board arrives at component mounting device 16 differs depending on the position of component mounting device 16 in component mounting lines 91 and 92, and the arrival time point becomes later as component mounting device 16 is located further downstream. In the present embodiment, the time period until a circuit board arrives at component mounting device 16 is calculated for each of component mounting devices 16 based on work time information 303 and conveyance time information 304. As a result, the component exhaustion time period is predicted by reflecting the state of part mounting lines 91 and 92.

Extracting Section

Extracting section 205 extracts the "row" of a short "remaining time period" and a short "preparation limit time period" from the component table every predetermined time period, and displays the component exhaustion prediction table shown in (a) and (b) of FIG. 5 on display 105. (a) is an example of a screen in which the top seven rows of a shorter remaining time period are extracted, and the extracted rows are displayed in the order of shorter remaining time period. (b) is an example of a screen in which the top seven rows of shorter preparation limit time period are extracted, and the extracted rows are displayed in the order of shorter remaining time period. The screens shown in (a) and (b) are alternately switched, for example, each time a specific key of the keyboard is pressed.

The component exhaustion prediction table is a table in which items of "No", "device name", "remaining time period", "preparation limit", "information", "slot", "state" and "component name" are set as one set. The values of "device name", "component exhaustion time period", "preparation limit time period", "slot number", "state" and "component name" in the component table are input as the values of "device name", "remaining time period", "preparation limit", "slot", "state" and "component name", respectively. When the value of the "state" is "not delivered", an operator can change the value to "front of device" by operating operation section 106. When the value of the "state" is changed to "front of device", component-exhaustion predicting section 203 changes the corresponding column of the component table to (front of device). When tape reel 27 is moved to front-of-device component shelf 94, the operator changes the value to "front of device".

When the value of "interruption presence/absence" of the extracted row of the component table is (OK), extracting section 205 highlights the corresponding row of the component exhaustion prediction table so as to be displayed differently from the other rows. Here, highlighting means, for example, displaying the background color as yellow and blinking the background color. In addition, for example, an upward arrow and an interruption time period are displayed in the "information" column of the component exhaustion prediction table. The interruption time period is an elapsed time period from the start of the interruption of the interrupted device to the present time point. Extracting section 205 calculates and displays the interruption time period by subtracting the current time point from the "interruption time point" in the component table. It should be noted that FIG. 5(a) shows a case in which rows of "No" 4 and 5 are highlighted, and FIG. 5(b) shows a case in which rows of "No" 1 and 7 are highlighted. The units of the values of "remaining time period", "preparation limit", and "information" are "minutes".

If replenishment work that is highlighted, i.e., a replenishment work having a component exhaustion time period possibly extended, overlaps with a non-highlighted replenishment work, an operator may preferentially perform the non-highlighted replenishment work. In addition, since the "preparation limit" reflecting the replenishment time period is displayed, when there are replenishment works in which the component exhaustion time period is the same but the value of the "state" is different, the operator can preferentially perform the replenishment work in which the value of the "preparation limit" is smaller, that is, the replenishment work takes a longer time period. The operator can also perform the replenishment works with the same value of "state". For example, in the case where there are multiple replenishment works in which the "state" is "not delivered", the first stage of the replenishment work in which there is a margin in the preparation limit time period can be performed together with the replenishment work in which the value of the "preparation limit" is small. When there is a replenishment work in which the "state" is "prepared", the operator can perform the second work of the replenishment work before component mounting device 16 stops due to the exhaustion of components by waiting in the vicinity of component mounting device 16 in advance. As a result, the working rate of the production line can be maintained.

Here, display 105 is an example of a notification section, replenishment time period calculating section 204 is an example of a replenishment time point calculating section, and operation device 29 is an example of a device notification section. Further, the remaining time period is an example of component exhaustion time point and the preparation limit is an example of component supply time point.

As described above, according to the embodiment described above, the following effects are obtained. Specifying section 201 updates the time table based on the arrival time point or the unloading time point in each of component mounting devices 16. Arrival predicting section 202 predicts the arrival time point of the circuit board in each of component mounting devices 16 based on the time table, and updates the prediction table. Since component-exhaustion predicting section 203 calculates the component exhaustion time point based on the prediction table, the component exhaustion time point can be predicted with high accuracy. Supply time period calculating section 204 calculates the replenishment time period in accordance with the value of the "state" of the component table indicating the current storage position of tape reel 27. An operator who operates component mounting device 16 can perform the replenishment work of tape reel 27 in accordance with the component exhaustion based on the component exhaustion time point or the component supply time point reported by display 105.

When there is component mounting device 16 in which the mounting work is interrupted in component mounting lines 91 and 92, arrival predicting section 202 predicts the arrival time point based on the current time point. An operator can perform the replenishment work of tape reel 27 based on the component exhaustion time point or the component supply time point in which the work state of component mounting devices 16 of component mounting lines 91 and 92 is reflected. When the mounting work of component mounting device 16 is interrupted, extracting section 205 highlights a row that may be delayed due to the interruption in the component exhaustion prediction table, and displays the interruption time period. As a result, the operator can efficiently perform the replenishment work.

The present disclosure is not limited to the above-mentioned embodiment, and can be changed in various manners in a range not departing from the gist of the disclosure. It has been described that the component exhaustion prediction table is displayed on display 105, but the configuration may also be such that the component exhaustion prediction table is displayed on, for example, operation device 29 included in component mounting device 16. When management controller 100 and component mounting device 16 are located apart from each other, an operator can confirm the nearest display.

In the embodiment, the case where the mounting work of component mounting device 16 is interrupted has been described, but the present application can also be applied to the case where the production by component mounting lines 91 and 92 is started. Even at the start of production, there is a state in which no circuit board exists in component mounting lines 91 and 92, in some cases. Therefore, also at the start of production, the configuration is preferably such that the arrival time point in each of component mounting devices 16 is predicted in the same manner as in the case where the mounting work of component mounting device 16 is interrupted. The state at the start of production includes the case where the type of a circuit board is changed as well as the case where the production line having been stopped restarts.

In addition, in the arrival prediction processing, only the method of calculating the arrival time point in component mounting device 16 on the downstream side of an interrupted device when there is the interrupted device has been described, but the configuration may also be such that the component exhaustion time point in component mounting device 16 on the upstream side of the interrupted device is calculated. In the case where there is an interrupted device, since component mounting device 16 on the upstream side cannot unload a circuit board, the mounting work is interrupted in the same manner as on the downstream side. More specifically, the configuration is preferably such that the time period from the start of the mounting work of the interrupted device to the start of the work of component mounting device 16 on the upstream side is estimated as, for example, the work time period of the interrupted device, and the work time period of the interrupted device is added to the component exhaustion time point of component mounting device 16 on the upstream side, thereby updating the component exhaustion time point.

In addition, component mounting device 16 has been described as transmitting the arrival signal and the unloading signal, but the configuration may be such that at least one of the arrival signal or the unloading signal is transmitted. Specifying section 201 has been described as updating the time table based on the arrival time point and the unloading time point, but may be configured to update based on at least one of the arrival time point or the unloading time point.

In addition, description has been made that the "remaining time period" until the part is exhausted and the "preparation limit" which is the time period until the start of the replenishment work are displayed in the part exhaustion table, but the configuration may also be such that the "time point" is displayed instead of the "time period".

In addition, description has been made that an operator can change the value of the "state" from "not delivered" to "front of device" on the display screen of the component exhaustion prediction table, but the present disclosure is not limited to this. For example, component management system 10 may have a configuration in which an input device is provided near component warehouse 95, and when an operator moves tape reel 27, the input device is operated to change the value of the "state".

The configuration of component mounting device 16 is not limited to the above.

For example, it may be a rotary head type device in which a mounting head rotates. Further, component management system 10 has been described as having component mounting devices 16 of the same configuration, but may have a configuration in which component mounting devices of different configurations are installed. In addition, descriptions have been made with respect to component mounting devices 16 included in component mounting lines 91 and 92, but the present disclosure can also be applied to a production line. For example, the configuration is preferably such that the arrival time point to each device is predicted based on, for example, the time point at which a circuit board is carried into each device on the production line.

REFERENCE SIGNS LIST

10 component management system, 16 component mounting device, 29 operation device, 91 component mounting line, 100 management controller, 106 operation section, 201 specifying section, 202 arrival predicting section, 203 predicting section, 204 replenishment time period calculating section, 205 extracting section

The invention claimed is:

1. A component management method for managing component mounting on a board in a component mounting line in which multiple work devices, including at least one component mounting device, are arranged in a line, the method comprising:
   specifying a location of each board at the component mounting line;
   predicting an arrival time point of each board in a target device, which is one of the component mounting devices, based on the location specified by the specifying;

calculating a mountable number of boards based on the number of components remaining and the number of components to be mounted per board in the target device;

calculating an arrival time point of a next board to be mounted after the mountable number of boards are mounted in the target device;

calculating a component exhaustion time point, at which the component is exhausted in the target device, by subtracting a current time point from the arrival time point of the next board to be mounted after the mountable number of boards are mounted in the target device;

calculating a component replenishment time point, which is a start time limit of component replenishment, by subtracting a replenishment time period required for the component replenishment from the component exhaustion time point;

reporting the component exhaustion time point and the component replenishment time point, and reporting a delay of the component exhaustion time point when mounting of the upstream device is interrupted based on a change in the arrival time point of the next board; and performing replenishment work in the at least one component mounting device based on at least one of the component exhaustion time point or the component replenishment time, wherein the method further comprises specifying the location by acquiring the arrival time point or an unloading time point of the board at each of the working devices, predicting the arrival time point based on the unloading time point, a work time period of each of upstream devices located upstream of the target device, and a conveyance time period required for the board to be conveyed from the upstream device to the target device, determining an interruption of mounting work for each of the upstream devices located upstream of the target device, when the mounting work of at least one of the upstream devices is interrupted, calculating an updated arrival time point of a board to the target device after the board already unloaded from the interrupted device based on the current time point, the work time of the interrupted device, the work time of each of the upstream devices on the component mounting line from the interrupted device to the target device, and the conveyance time from the interrupted device to the target device, calculating an updated component exhaustion time point based on the updated arrival time point, and calculating an updated component replenishment time point based on the updated component exhaustion time point.

2. The component management method according to claim 1, further comprising reporting an elapsed time period from the interruption when mounting of the upstream device is interrupted.

3. The component management method according to claim 1, wherein when the component mounting device in the component mounting line includes multiple component mounting devices, the method further comprises reporting the component exhaustion time point in an order of earlier time point based on the arrival time point predicted for each of the component mounting devices.

* * * * *